United States Patent
Marrow et al.

(10) Patent No.: US 8,443,244 B2
(45) Date of Patent: May 14, 2013

(54) BLIND AND DECISION DIRECTED MULTI-LEVEL CHANNEL ESTIMATION

(75) Inventors: Marcus Marrow, San Jose, CA (US); Jason Bellorado, San Jose, CA (US); Rajiv Agarwal, Palo Alto, CA (US)

(73) Assignee: SK hynix memory solutions inc., San Jose, CA (US)

( * ) Notice: Subject to any disclaimer, the term of this patent is extended or adjusted under 35 U.S.C. 154(b) by 0 days.

(21) Appl. No.: 13/456,065

(22) Filed: Apr. 25, 2012

(65) Prior Publication Data

US 2012/0210180 A1    Aug. 16, 2012

Related U.S. Application Data

(63) Continuation of application No. 12/384,894, filed on Apr. 8, 2009, now Pat. No. 8,185,787.

(60) Provisional application No. 61/123,555, filed on Apr. 9, 2008.

(51) Int. Cl.
*G11C 29/00* (2006.01)
*G11C 11/34* (2006.01)

(52) U.S. Cl.
USPC ..................... 714/721; 365/185.03

(58) Field of Classification Search .......... None
See application file for complete search history.

(56) References Cited

U.S. PATENT DOCUMENTS

| | | | | |
|---|---|---|---|---|
| 6,141,393 | A * | 10/2000 | Thomas et al. | 375/347 |
| 7,423,912 | B2 * | 9/2008 | Perlegos et al. | 365/185.24 |
| 7,684,237 | B2 * | 3/2010 | Moschiano et al. | 365/185.02 |
| 7,751,237 | B2 * | 7/2010 | Alrod et al. | 365/185.02 |
| 7,990,764 | B2 * | 8/2011 | Alrod et al. | 365/185.02 |
| 8,060,806 | B2 * | 11/2011 | Shalvi et al. | 714/763 |
| 2008/0276156 | A1 * | 11/2008 | Gunnam et al. | 714/801 |
| 2008/0298127 | A1 * | 12/2008 | Kim et al. | 365/185.17 |
| 2008/0301521 | A1 * | 12/2008 | Gunnam et al. | 714/757 |
| 2009/0181718 | A1 * | 7/2009 | Lampe et al. | 455/550.1 |
| 2010/0135074 | A1 * | 6/2010 | Alrod et al. | 365/185.02 |
| 2010/0232205 | A1 * | 9/2010 | Parkinson | 365/148 |

OTHER PUBLICATIONS

Min-Hwa Chi; Bergemont, A.; , "Low-voltage multi-level flash memory: determination of minimum spacing between multi-levels [CMOS]," Semiconductor Electronics, 1996. ICSE '96. Proceedings., 1996 IEEE International Conference on , vol., no., pp. 1-5, Nov. 26-28, 1996.*

* cited by examiner

*Primary Examiner* — Ajay Bhatia
*Assistant Examiner* — Daniel McMahon
(74) *Attorney, Agent, or Firm* — Van Pelt, Yi & James LLP

(57) ABSTRACT

A read value that is read from a multi-level storage device is received, as are a set of bins having bin ranges. A set of amounts corresponding to the set of bins is received where each amount in the set indicates an amount of read values which fall into the corresponding bin. One or more of the bin ranges is adjusted, including by: in the event there is a first bin range that is less than the received read value, increasing at least the first bin range and in the event there is a second bin range that is greater than the received read value, decreasing at least the second bin range.

23 Claims, 11 Drawing Sheets

BLIND AND DECISION DIRECTED MULTI-LEVEL CHANNEL ESTIMATION

CROSS REFERENCE TO OTHER APPLICATIONS

This application is a continuation of co-pending U.S. patent application Ser. No. 12/384,894 entitled BLIND AND DECISION DIRECTED MULTI-LEVEL CHANNEL ESTIMATION filed Apr. 8, 2009 which claims priority to U.S. Provisional Patent Application No. 61/123,555 entitled BLIND MULTI-LEVEL CHANNEL ESTIMATION filed Apr. 9, 2008 which is incorporated herein by reference for all purposes.

BACKGROUND OF THE INVENTION

Some storage systems, such as Flash memory, permit one of multiple possible levels (e.g., voltage levels) to be stored in a unit of storage (e.g., a cell in a Flash memory system). This permits multiple bits to be stored per unit of storage. For example, if four possible (voltage) levels can be stored, then each unit has a 2-bit storage capacity. In general, if there are M levels per unit of storage this corresponds to $\log_2(M)$ bits/unit of storage. For a variety of reasons, the level read back from storage media may not be the same level as what was originally written. In a Flash memory system, some examples include temperature variation (e.g., depending upon the ambient temperature, the level read back will vary), data retention issues (e.g., over time, leakage from a cell transistor's floating gate causes the stored and read back voltage to decrease), and transmission line effects (e.g., observed as a ramp in the read back voltage that gradually increases from one end of a transistor string (i.e., wordline) to the other end). Regardless of the underlying cause, storage systems attempt to compensate or otherwise adjust for this using channel estimation.

One channel estimation technique involves the usage of reference cells. Reference cells are cells used to stored overhead information (i.e., not user data) and in particular for channel estimation, the reference cells are used to store known values. The values are later read back and then the channel is estimated using the known, stored values and the level that was actually read back. There are two disadvantages associated with performing channel estimation in this manner. First, a maximum number of cells are typically allocated to be reference cells and these reference cells are also used to store code information so that the read back data can be decoded (e.g., using an error correction or error detection code). Channel estimation relies on a sufficiently large number of samples and thus the strength of a code suffers since there are a limited number of reference cells. Another disadvantage is that a reference cell can become damaged or defective (e.g., sometimes referred to as a slow or stuck cell). If this occurs and a statistically insufficient number of stored values are used for channel estimation (e.g., because of the requirements of the code and/or the limited number of reference cells), then channel estimation will suffer. It would be desirable to develop new channel estimation techniques which overcome some or all of these issues.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
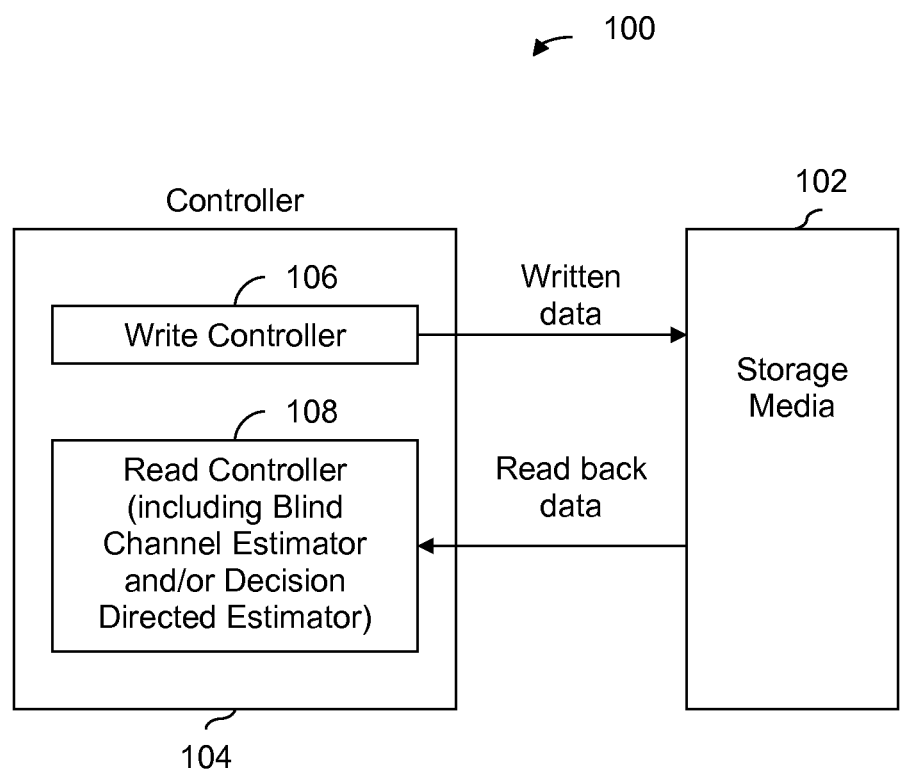
FIG. 1 is a block diagram illustrating an embodiment of a multi-level storage device.

FIG. 1 is a block diagram illustrating an embodiment of a multi-level storage device. In the example shown, storage device 100 includes controller 104 and storage media 102. In some embodiments described herein, storage media 102 includes Flash storage (e.g., NAND Flash storage). In some embodiments, storage media 102 is some other media besides Flash. The technique described herein apply to any multi-level communications system, including NAND or NOR flash, as well as wireless systems, modem communication, etc.

Controller 104 includes write controller 106 and read controller 108, which send write data and receive read data from storage media 102. In the examples described herein, a unit of storage is capable of storing multiple levels. For example, in the case of NAND Flash storage media, a cell is capable of storing 2, 4, or 8 levels. (These are merely examples and some other storage systems are capable of storing a different number of levels.) In some embodiments, a level is a voltage level.

Figure 2:
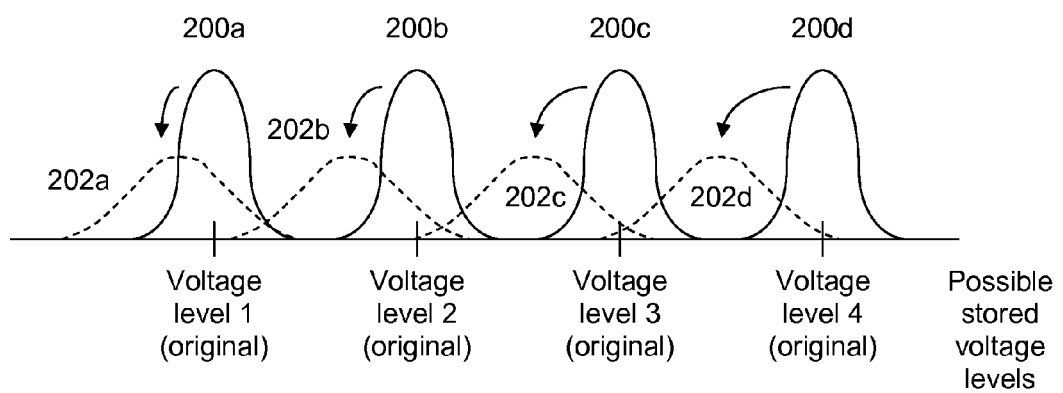
FIG. 2 is a diagram illustrating an example of the effect a channel has on levels read back from storage media.

FIG. 2 is a diagram illustrating an example of the effect a channel has on levels read back from storage media. In the example shown, the levels are voltage levels and there are four possible voltage levels. Distributions 200a-200d show distributions (sometimes referred to as histograms) for the four possible voltage levels at ideal or original voltage levels. In one example, the four voltage levels are 1 V, 2 V, 3 V, and 4 V. In some embodiments, some other voltage levels and/or number of levels are stored. When written to a unit of storage (e.g., a cell in NAND flash storage media), the voltages shown in distributions 200a-200d are written. One cell may have a slightly different level written even if the desired level is the same. For example, if the ideal or desired written voltage is 1 V, a first cell may actually have 0.9 V written to it whereas a second cell may have 1.1 V actually written to it. This variation amongst cells (or other units of storage) is represented by distributions 200a-200d.

During a read back, distributions 202a-202d are the values observed. In some cases, the shift from distributions 200a-200d to 202a-202d occurs over a relatively long period of time, for example if a few years elapse between writing and reading. This change from distributions 200a-200d to 202a-202d (respectively) is modeled as and referred to as a channel effect. To properly process the read back signal, a read controller (e.g., read controller 108 in FIG. 1) performs channel estimation. What is disclosed herein are a blind channel estimator and decision directed estimator (which can be used separately or together) to perform channel estimation.

Figure 3A:
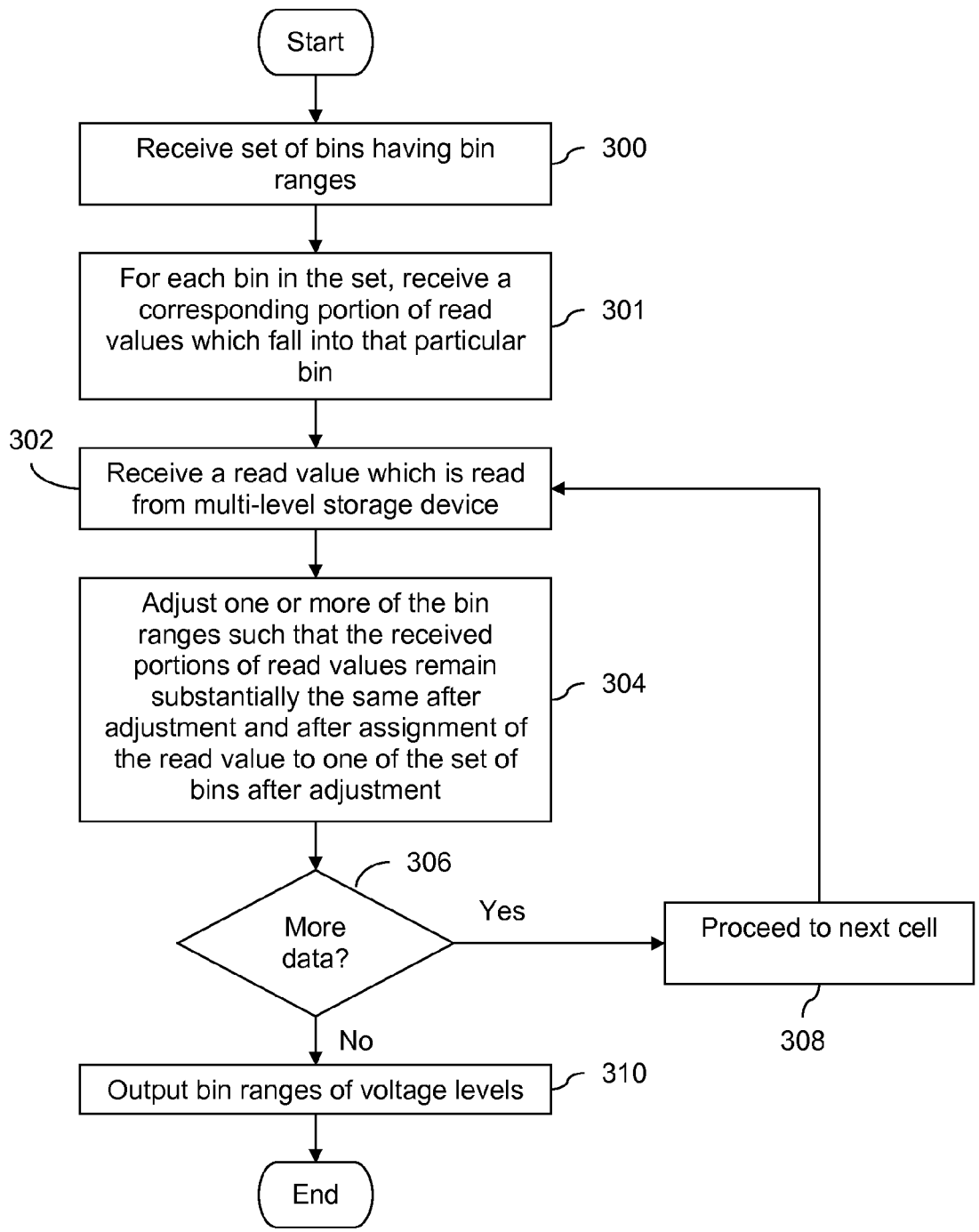
FIG. 3A is a flowchart illustrating an embodiment of a blind channel estimation process.

FIG. 3A is a flowchart illustrating an embodiment of a blind channel estimation process. In the example shown, blind channel estimation is performed on data read back from multi-level storage, such as (NAND) Flash memory. In some embodiments, a read controller (e.g., read controller 108 in FIG. 1) performs the process shown.

At 300, a set of bins having bin ranges is received. In various embodiments, the bin ranges extend from the center (e.g., mean or median) of a distribution to the center of another distribution (e.g., from the center of distribution 202a to the center of distribution 202b). See, for example, the bin ranges shown in diagram 350 in FIG. 3B. In some other embodiments, the bin ranges extend from one threshold (e.g., between distributions 202a and 202b) and another threshold (e.g., between distributions 202b and 202c). See, for example, the bin ranges shown in diagram 352 in FIG. 3B.

At 301, for each bin in the set, a corresponding portion of read values which fall into that particular bin is received. For example, in 350 in FIG. 3B, the lowest and highest bins will have $1/8^{th}$ of the read back voltages and the other bins will have $1/4^{th}$ of the read back voltages. In 352, each of the four bins has $1/4^{th}$ of the read back voltages.

Figure 3B:
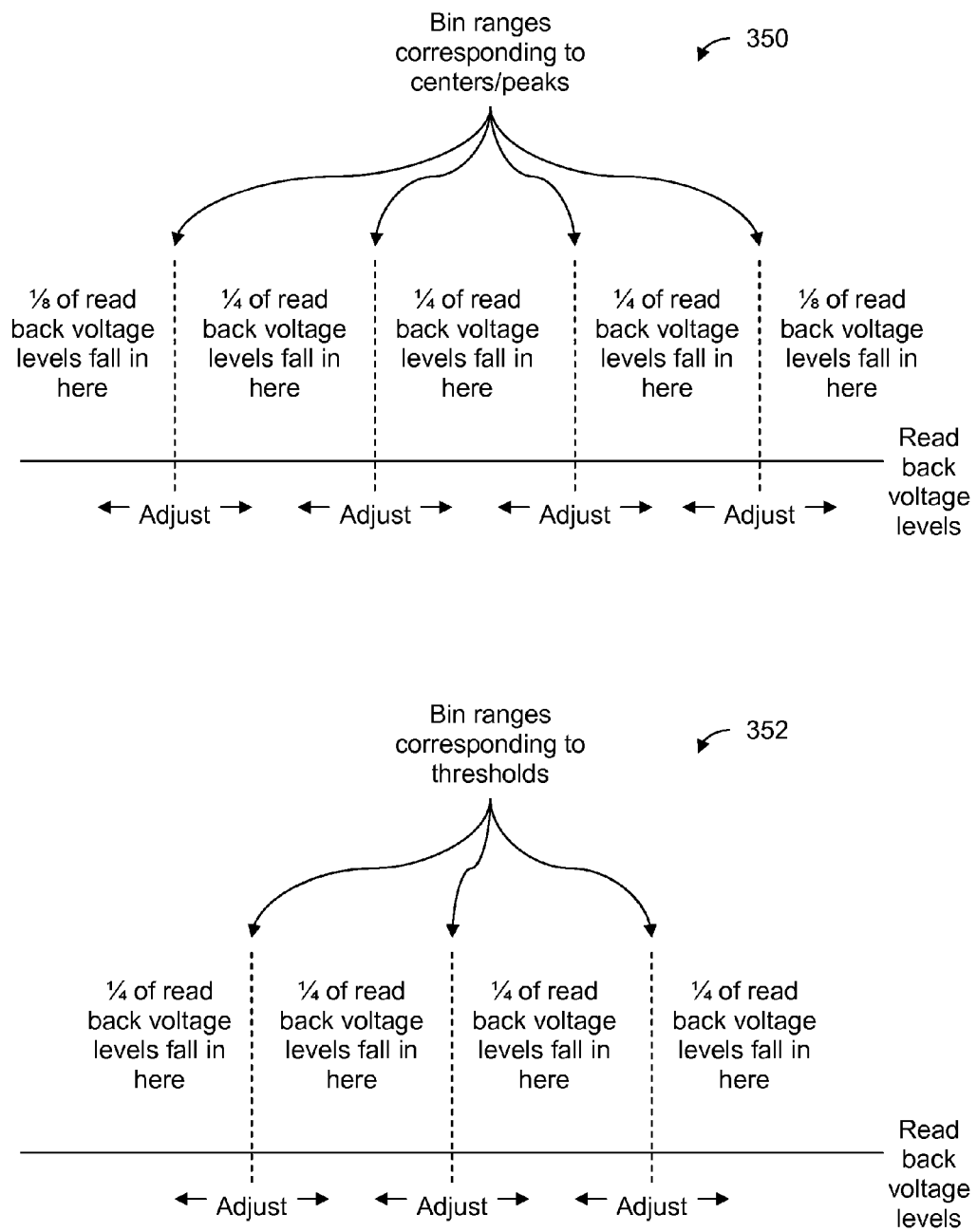
FIG. 3B is a diagram showing two embodiments of bin ranges.

At 302, a read value which is read from a multi-level storage device is received. One or more of the bin ranges is/are adjusted such that the received portions of read values remain substantially the same after adjustment and after assignment of the read value to one of the set of bins after adjustment at 304. That is, each bin has a corresponding fraction or portion of the read voltages and these fractions are maintained by adjusting the bin ranges. For example, one or more bin ranges in FIG. 3B are adjusted so that the $1/4^{th}$ (and $1/8^{th}$) portions are maintained even after assigning the read value to one of the bins.

In some embodiments, adjustment at 304 includes incrementing or decrementing a previous value (e.g., $k*\mu$, where k is an integer and $\mu$ is a step size). In one example, the value of $\mu$ is determined by "sweeping" $\mu$ and finding the $\mu$ which provides the best bit error-rate. In one example, the optimal value of $\mu$ depends on how much the levels have moved between write and read (e.g., if the levels have only moved a small amount, there is no reason to use a large $\mu$ which permits the levels to move quickly, alternatively, if the levels have moved a significant amount or vary drastically from one end of a word-line to the other (sometimes referred to as ramp), then a larger $\mu$ might be preferred). In some embodiments, it is in the form of a gradient descent in that it uses a noisy value to move parameters which, hopefully, improve the system performance.

It is determined at 306 whether there is more data. For example, if cells in a wordline are being processed, it is determined whether there are remaining cells in the wordline. In some embodiments, cells in a page are read back and processed. If there is additional data, the process proceeds to the next cell at 308. Otherwise, the bin ranges of voltage levels are output at 310. For example, the bin ranges in FIG. 3B are output after multiple iterations.

The techniques described in FIG. 3A and may be implemented in variety of ways, including as a computer program product or as a system. In one example of a system, an interface performs steps 300-302 and 310 and a processor performs the other steps.

One example, to illustrate the process described above in embodiments where the bin ranges correspond to centers, is:
  (1) Set i=0. Initialize bin-centers $[c^1_0, c^2_0, \ldots, c^M_0]$ and find an (optimal) value of $\mu$. Note that a small value of $\mu$ is more robust to outliers, as averaging over a greater number of cells is being conducted, however, convergence is slow. The opposite is true for a large value of $\mu$. In some embodiments, an (optimal) value of $\mu$ is empirically determined and is dependent upon the characteristics of the storage medium.
  (2) Increment i by 1
  (3) Read $i^{th}$ cell to obtain $x_i$
  (4) Update the M bin-centers as $$c^n_i = \begin{cases} c^n_{i-1} + \mu(2n-1), & \text{if } x_i > c^n_{i-1} \\ c^n_{i-1}, & \text{if } x_i = c^n_{i-1} \\ c^n_{i-1} - \mu(2M - (2n-1)), & \text{if } x_i < c^n_{i-1} \end{cases}$$

for n=1 to M (where M is the number of possible voltage levels stored in a unit of storage)
  Regarding the index n, it is not that larger levels get larger steps compared to smaller levels since it depends on where the read-back value falls as to what step-size is used. For example, L0 either moves by +1 (if $x_i$>L0) or by −(2M−1) (if $x_i$<L0). In the steady-state, there should be, for every 1 sample<L0 exactly (2M−1) levels>$x_i$. So, over a large amount of data, these movements should have a net zero effect. For 4 levels, L0 has ⅛ of the samples below it and ⅞ of the levels above it. The actual movements are +⅛ for $x_i$>L0, and −⅞ for $x_i$<L0.

(5) If i is less than N, go to step 2 and continue, else stop and output the set of vectors, $[c^1_i, c^2_i, \ldots, c^M_i]$ for i=0, 1, 2, . . . , N−1.

By supplying a set of levels for each time index i, the levels are able to vary across the word-line, which is useful in estimating the ramp described above.

Another example, to illustrate the process described above in embodiments where the bin ranges correspond to thresholds, is:

(1) Set i=0. Initialize threshold values $[w^1_0, w^2_0, \ldots, w^{M-1}_0]$ and find a (optimal) value of μ.
(2) Increment i by 1
(3) Read $i^{th}$ cell to obtain $x_i$
(4) Update the (M−1) thresholds as $$w_i^m = \begin{cases} w_{i-1}^m + \mu \frac{m}{M}, & \text{if } x_i > w_{i-1}^m \\ w_{i-1}^m, & \text{if } x_i = w_{i-1}^m \\ w_{i-1}^m - \mu \frac{M-m}{M}, & \text{if } x_i < w_{i-1}^m \end{cases}$$

for m=1 to (M−1)

For the 4-level example, ¼ of the samples are<L0 (which is now a threshold and not a level) and ¾ of the samples are>L0.

(5) If i is less than N, go to step 2 and continue, else stop and output the set of vectors $[w^1_i, w^2_i, \ldots, w^{M-1}_i]$, for i=0, 1, 2, . . . , N−1.

Although the process shown in this figure and some other figures are represented as iterative processes, the scope of the technique includes non-iterative processes as well. For example, all data may be input at the beginning of such a non-iterative process, the bin ranges are adjusted so that each range has an appropriate number of read-back values falling within that range, and the bin ranges are output.

For the blind channel estimation technique described herein, it is assumed the number of samples, data points, and/or iterations used is sufficiently large enough from a statistical point of view. In some embodiments, a check is performed at the start of the process described above to ensure the value of N (e.g., where i is 0, . . . , N−1) is sufficiently large enough. An appropriate or sufficient value of N will depend upon the number of possible (voltage) levels that can be stored in a unit of storage (e.g., 16 possible voltage levels will require more samples or data than a system that stores 4 possible voltage levels). In general, the number of (voltage) levels able to be stored by a unit of storage is called M (e.g., M=2, 4, 8, etc. for various systems).

Also, this blind channel estimation technique relies upon a relatively even distribution of read-back values amongst the M possible read-back voltage levels. For example, the technique may not necessarily perform optimally if all of the read-back values are one of the possible M voltage levels. In some embodiments, there is some pre-processing to ensure a relatively equal or even distribution of read-back voltage values. In one example, a scrambler (e.g., in a write controller prior to writing or in a read controller after reading back a stored value) is used to ensure data values are sufficiently distributed amongst the possible M levels. In another example, a checker or counter is used to forward read back values for processing if it is not one for which too many values have already been received, otherwise it is discarded.

FIG. 3B is a diagram showing two embodiments of bin ranges. In the example shown, diagram 350 shows bin ranges corresponding to centers or peaks. There are four possible voltage levels that are able to be stored and the bin ranges are adjusted as needed so that the outermost bins each have ⅛ of the read-back voltages levels and the other three bins each have ¼ of the read-back voltages as they are read back and assigned to bins. Diagram 352 shows bin ranges corresponding to thresholds or borders. There are four possible voltage levels that are able to be stored and the bin ranges are adjusted as needed so that each bin has ¼ of the read-back voltages levels as they are read back and assigned to the bins.

Figure 4A:
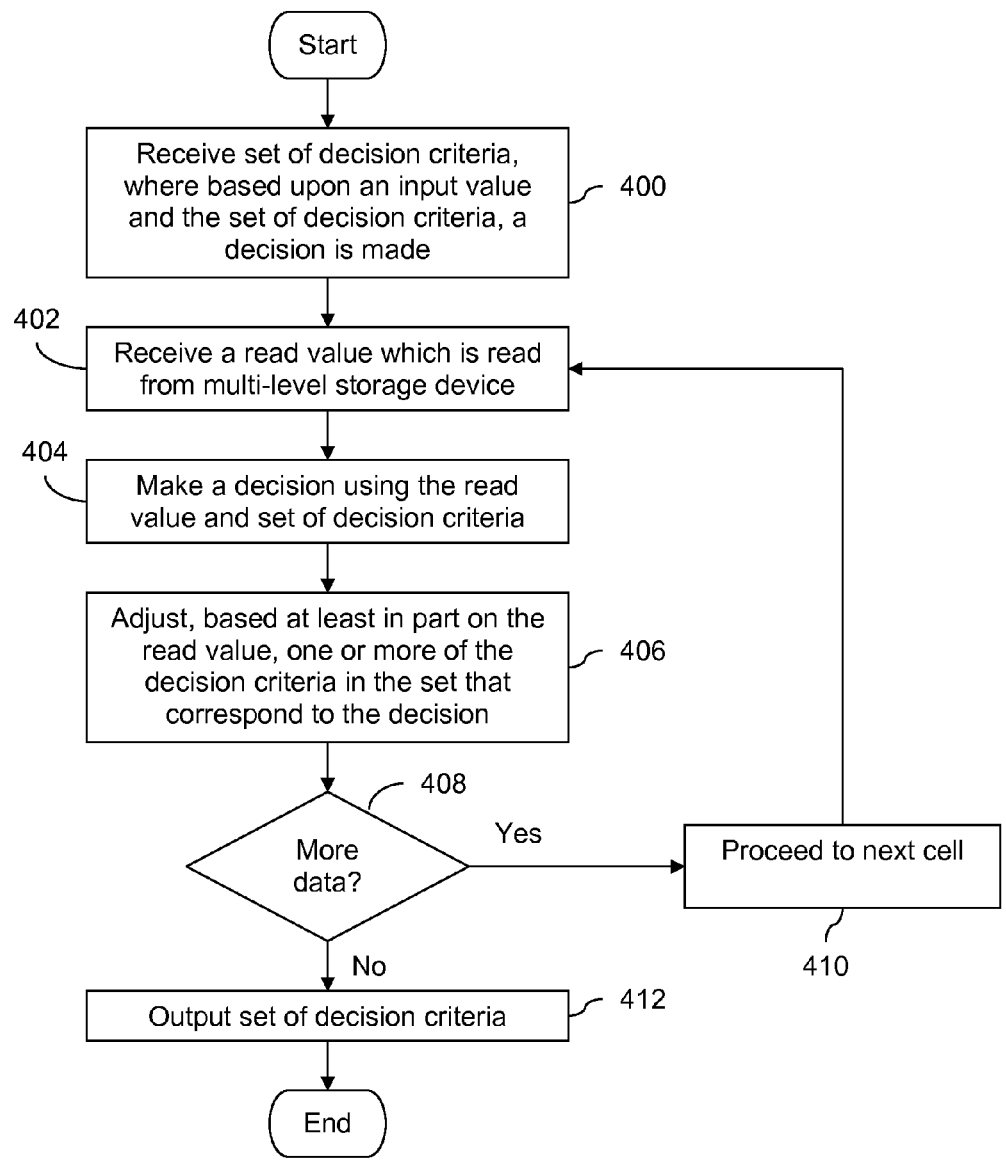
FIG. 4A is a flowchart illustrating an embodiment of a process for decision directed estimation.

FIG. 4A is a flowchart illustrating an embodiment of a process for decision directed estimation. In some embodiments, decision directed estimation is performed in combination with blind channel estimation (e.g., blind channel estimation is performed first in a first pass and then decision directed estimation is performed in a second pass using the same cells). In some embodiments, decision directed estimation is performed alone or in combination with some other technique (e.g., default or ideal bin ranges, obtain bin ranges using reference cells, etc.)

Figure 4B:
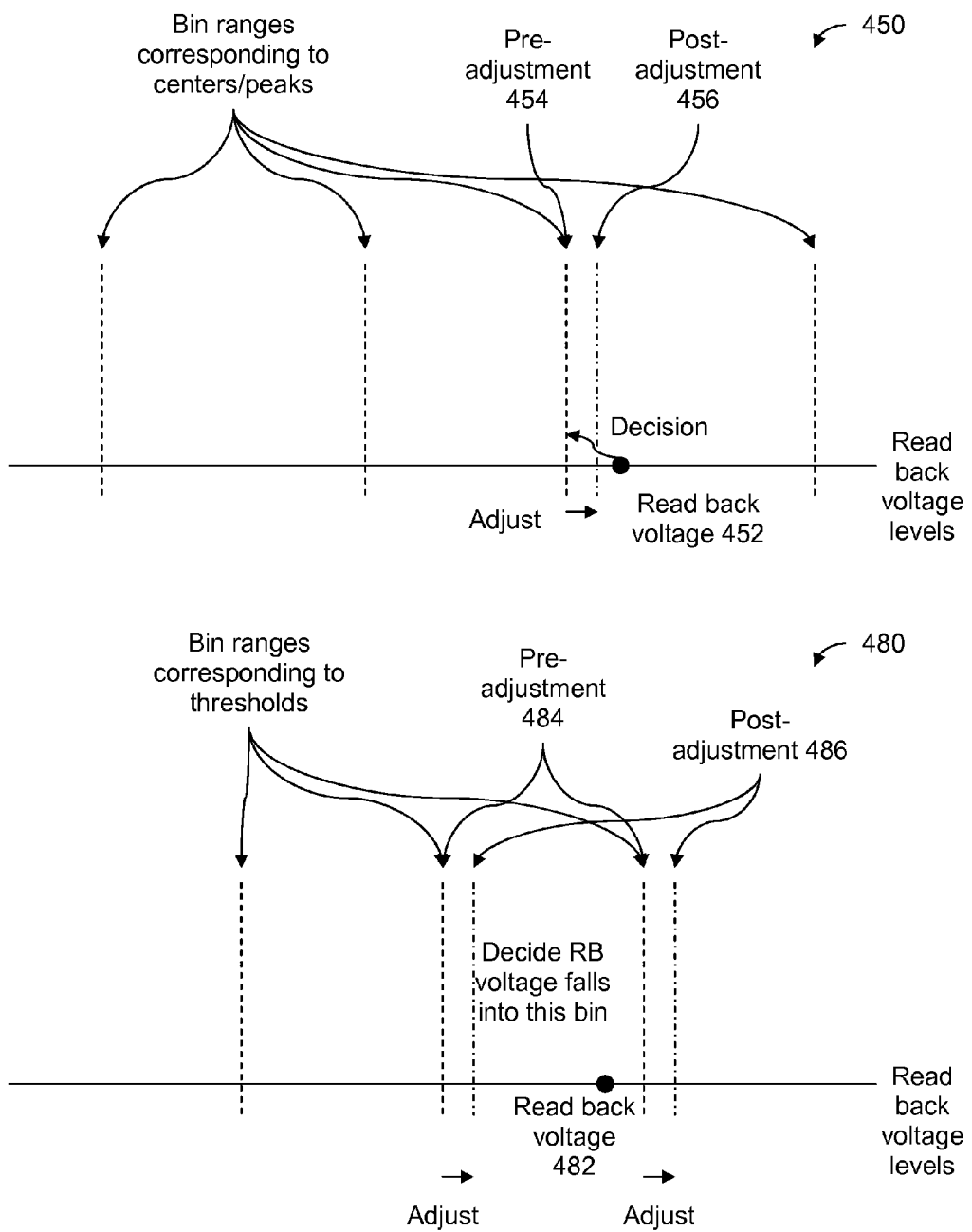
FIG. 4B is a diagram illustrating an embodiment of two example bin ranges related to decision directed channel estimation.

At 400, a set of decision criteria is received, where based upon an input value and the set of decision criteria, a decision is made. FIG. 4B is a diagram illustrating an embodiment of two example bin ranges related to decision directed channel estimation. In diagram 450 of FIG. 4B it is decided which bin range a read back value is closest to. In diagram 480 of FIG. 4B it is decided which bin a read back value falls within. In the examples shown in FIG. 4B, the decision criteria comprises a set of bins having bin ranges.

A read value is received which is read from a multi-level storage device at 402. At 404, a decision is made using the read value and set of decision criteria. For example, in diagram 450 of FIG. 4B, a decision is made that read back voltage 452 is closest to line 454. In diagram 480 of FIG. 4B, a decision is made that read back voltage 482 falls within the bin ranges of 484.

At 406, one or more of the decision criteria in the set that correspond to the decision is/are adjusted based at least in part on the read value. For example, in diagram 450 in FIG. 4B, read back voltage 452 is to the right of pre-adjustment line 454 so it is shifted to the right to become post-adjustment line 456. In diagram 480 in FIG. 4B, pre-adjustment ranges 484 are moved to the right to become post-adjustment ranges 486 so that read back voltage 482 is more "centered." In some embodiments, an adjustment includes incrementing or decrementing a previous value.

It is determined at 408 whether there is more data. If so, the process proceeds to a next cell at 410. Otherwise, the set of decision criteria is output at 412. For example, after multiple iterations of adjustment, the decision criteria shown in diagram 450 or 480 in FIG. 4B is output.

The techniques described in FIG. 4A may be implemented in variety of ways, including as a computer program product or as a system. In one example of a system, an interface performs steps 400, 402, and 412 and a processor performs the other steps.

To illustrate the technique, in one example below, blind channel estimation is performed in a first pass of the cells, decision directed estimation is performed in a second pass of the cells, and the bin ranges correspond to centers:

(1) Set i=N+1. Let initial bin-centers at the end of $1^{st}$ pass be $[c^1_i, c^2_i, \ldots, c^M_i]$ and find a (optimal) value of $\mu$.
(2) Make a bin decision on the $i^{th}$ cell using $[c^1_i, c^2_i, \ldots, c^M_i]$ to obtain $z_i$. Bin decisions are made as:

$z_i = n$ if $|x_i - c_i^n| \leq |x_i - c_i^m| \forall m \neq n$ (3) Decrement i by 1. In this example (as opposed to the flowchart of FIG. 4A), i decreases with each iteration.
(4) Update the M bin-centers as $$c_i^n = \begin{cases} c_{i+1}^n + \mu(z_i - c_{i+1}^n), & \text{if } z_i = n \\ c_{i+1}^n, & \text{if } z_i \neq n \end{cases}$$

for n=1 to M
(5) If i is greater than 0, go to step 2 and continue, else stop and output the set of vectors $[c^1_i, c^2_i, \ldots, c^M_i]$, i=0, 1, 2, ..., N−1.

In some embodiments, decision directed estimation is used in combination with a decoder that makes soft decisions (e.g., a low-density parity-check (LDPC) code or system is used) and such systems or codes require log-likelihood ratios (LLR's) as input to the (e.g., LDPC) decoder. To illustrate, a hard decision decoder (in the binary case) would output a 0 or 1 whereas a soft decision decoder would output a likelihood, for example 0.1 if the decoder is very certain the decision is a 0, a 0.5 if the decoder is equally unsure, or a 0.9 if the decoder was very certain the decision is a 1. In some embodiments, other soft decision codes besides LDPC codes are used. In some embodiments, the variance of the histogram associated with each bin (or level) is estimated or otherwise generated in order to provide these LLR values to a decoder. In one example:
(1) Set i=N+1. Let initial bin-centers at the end of $1^{st}$ pass be $[c^1_i, c^2_i, \ldots, c^M_i]$ and find a (optimal) value of $\mu$.
(2) Initialize $\hat{\sigma}_i^{2,n} = 0, \forall n$
(3) Make a bin decision on the $i^{th}$ cell using $[c^1_i, c^2_i, \ldots, c^M_i]$ to obtain $z_i$. Bin decisions are made as:

$z_i = n$ if $|x_i - c_i^n| \leq |x_i - c_i^m| \forall m \neq n$ (4) Decrement i by 1.
(5) Update the M bin-centers as $$c_i^n = \begin{cases} c_{i+1}^n + \mu(z_i - c_{i+1}^n), & \text{if } z_i = n \\ c_{i+1}^n, & \text{if } z_i \neq n \end{cases}$$

for n=1 to M
(6) Update the M bin-variances as $$\hat{\sigma}_i^{2,n} = \begin{cases} \hat{\sigma}_{i+1}^{2,n} + (x_i - c_i^n)^2, & \text{if } z_i = n \\ \hat{\sigma}_{i+1}^{2,n}, & \text{if } z_i \neq n \end{cases}$$

for n=1 to M
(7) If i is greater than 0, go to step 3 and continue, else go to step 8.
(8) Normalize the bin-variance estimates as $$\sigma_i^{2,n} = \frac{\hat{\sigma}_i^{2,n}}{N},$$

$\forall n$ and output variances

In some embodiments, variances and centers are passed to a soft-decision decoder (e.g., a LDPC decoder) as LLRs and means, respectively. Variances and centers (i.e. means) of these distributions are utilized to construct LLRs. LLRs are one specific example. In some embodiments, the means and variances of these distributions are used to construct probabilities (i.e., the probability that each of the bits written to a given cell were written as 0's or written as 1's). LLRs are just a way to represent those probabilities, but need not be the form passed to the soft-decision decoder.

As described above, blind decision estimation and decision directed estimation can be performed alone, alone in combination with other techniques, or together. The following show some example combinations.

Figure 5:
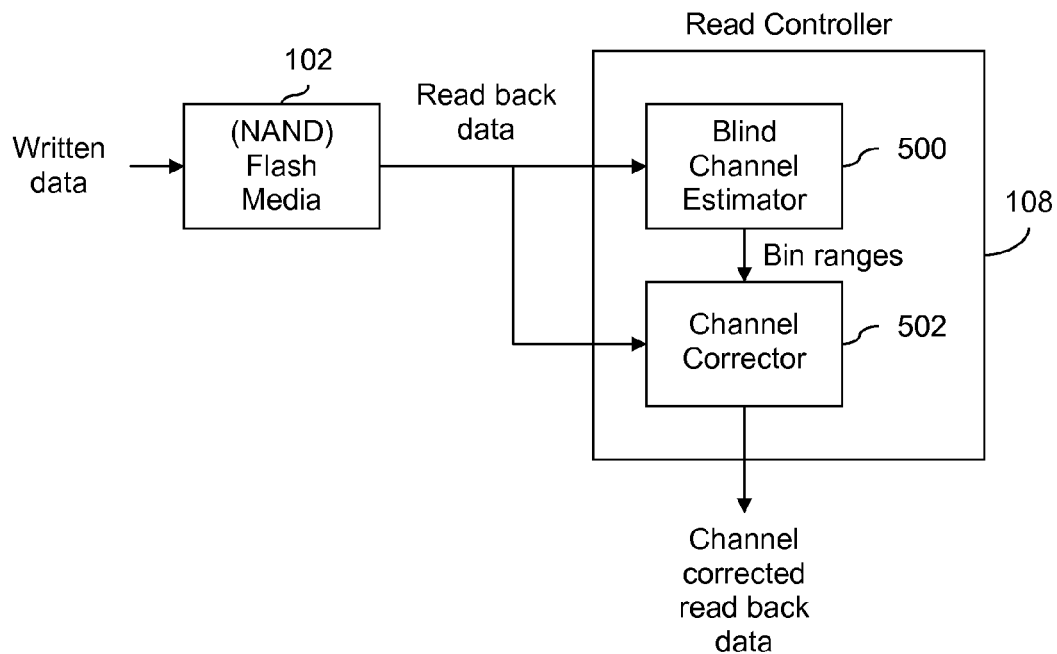
FIG. 5 is a diagram showing an embodiment of a read controller that includes a blind channel estimator and a channel corrector.

FIG. 5 is a diagram showing an embodiment of a read controller that includes a blind channel estimator and a channel corrector. In the example shown, storage media 102 from FIG. 1 includes (NAND) Flash media. Read data is passed from Flash media 102 to blind channel estimator 500 and to channel corrector 502. Blind channel estimator 500 performs blind channel estimation, for example using the process described in FIG. 3A. Bin ranges are passed from blind channel estimator 500 to channel corrector 502.

Using the bin ranges, the read data received from Flash media 102 is channel corrected by channel corrector 502. For example, over time Flash media can degrade and a read back value can be lower than expected or lower than levels stored when the device was new. In such cases where the levels decay or drop, channel corrector 502 increases the read back data to higher levels and the amount of the increase is specified by or otherwise controlled by the bin ranges output by blind channel estimator 500. In one example, originally a Flash cell stores the levels [1V 2V 3V 4V] and blind channel estimator 500 outputs [0.2V 1.2V 2.8V 4V]. In that example, the first level dropped (nominally) by 0.8V, the second level by 0.8V, the third level by 0.2V, and the fourth level by 0V (i.e., no performance degradation). In some embodiments, a read back value of 1.1V would be channel corrected to be 2V.

In various embodiments, the bin ranges output by blind channel estimator 500 correspond to a variety of cells. In some embodiments, a bin range is output for each cell or unit of storage. This may be undesirable in some applications, for example where the number of levels (M) is relatively small and/or it is undesirable to store a large amount of overhead information. In some embodiments, a bin range (sometimes referred to as a bin range vector) is output for cells in a page, for cells in a wordline, etc. This may be acceptable where cells in the same page or wordline degrade in a similar manner.

Figure 6:
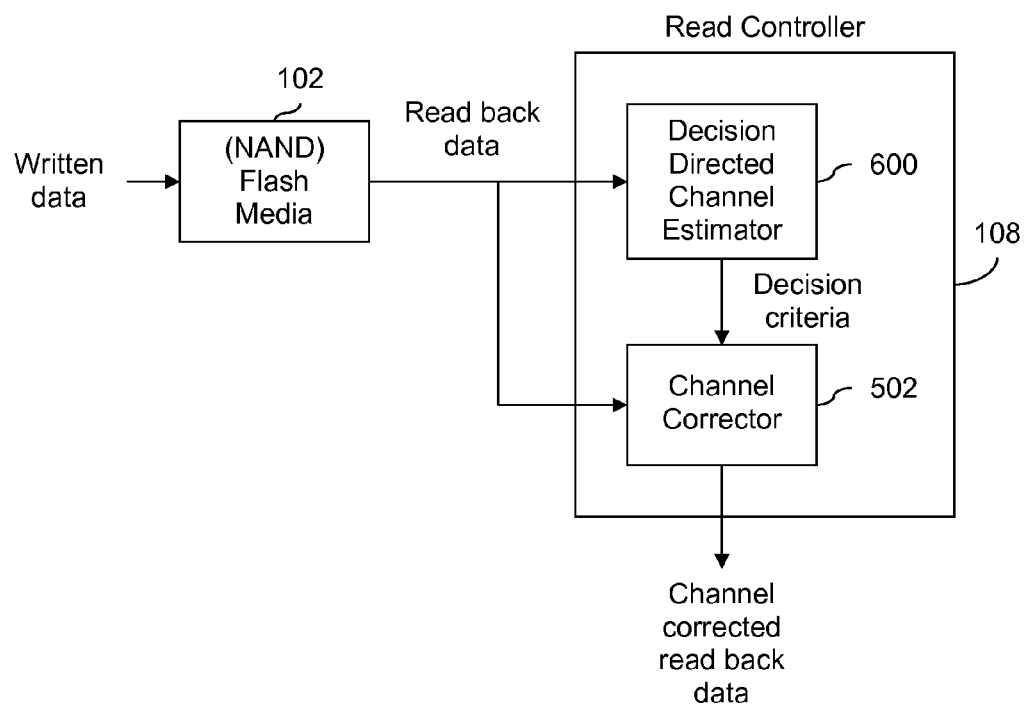
FIG. 6 is a diagram showing an embodiment of a read controller that includes a decision directed channel estimator and a channel corrector.

FIG. 6 is a diagram showing an embodiment of a read controller that includes a decision directed channel estimator and a channel corrector. As in the previous example, storage media 102 includes (NAND) Flash media and channel corrector 502 operates in the same manner as described in FIG. 5.

Decision directed channel estimator 600 performs decision directed channel estimation, for example using the process described in FIG. 4A. Decision criteria are passed from decision directed channel estimator 600 to channel corrector 502. In some embodiments, decision criteria includes bins having bin ranges.

In some embodiments, the decision criteria correspond to centers (e.g., diagram 450 in FIG. 4B) and channel corrector 502 selects the decision criteria closest to the read back value. In some embodiments, the decision criteria corresponds to thresholds (see e.g., diagram 480 in FIG. 4B) and channel corrector 502 determines which bin a read back value fall in.

As described in the previous example, decision criteria can be output for any number or group of cells or storage units.

Figure 7:
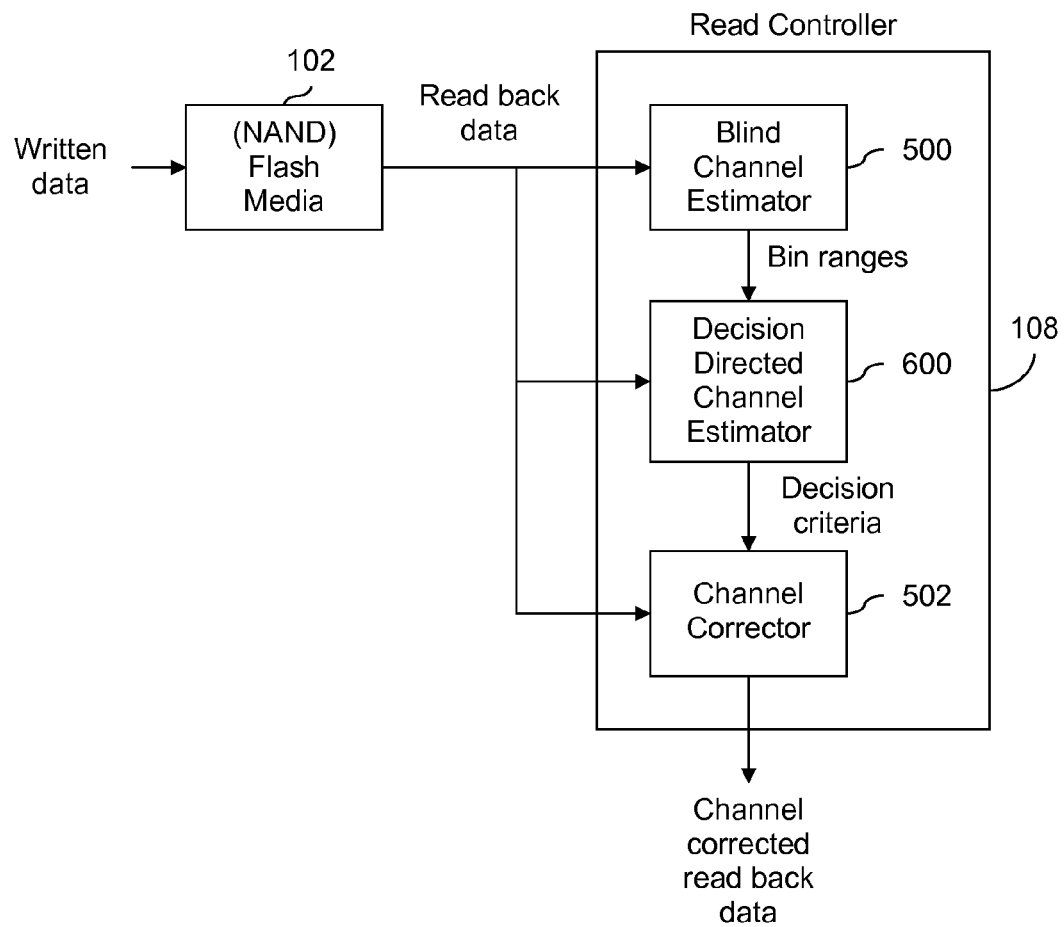
FIG. 7 is a diagram showing an embodiment of a read controller that includes a blind channel estimator and a decision directed channel estimator.

FIG. 7 is a diagram showing an embodiment of a read controller that includes a blind channel estimator and a decision directed channel estimator. As in the previous examples, storage media 102 includes (NAND) Flash media and channel corrector 502 operates in the same manner as described in FIG. 5.

In the example shown, blind channel estimation is used in a first pass. For example, read data from all cells in a page are passed to and processed by blind channel estimator 500. In this example, the same read data is passed to decision directed channel estimator and is processed in a second pass. The bin ranges passed from blind channel estimation as used as initial decision criteria by decision directed channel estimator 600. Decision directed channel estimator adjusts the decision criteria as needed and passes it to channel corrector 502.

Figure 8:
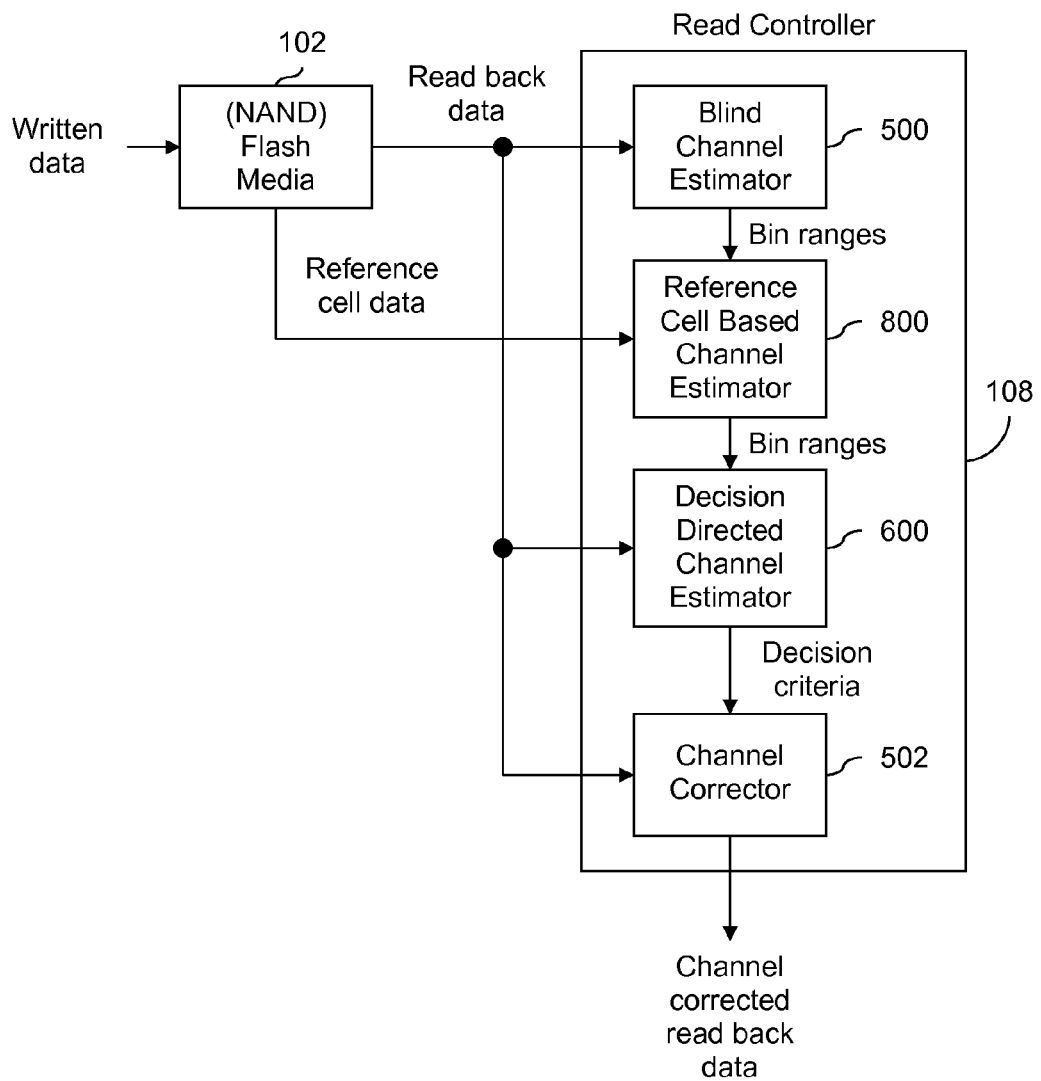
FIG. 8 is a diagram showing an embodiment of a read controller that includes a blind channel estimator, a reference cell based channel estimator, and a decision directed channel estimator.

FIG. 8 is a diagram showing an embodiment of a read controller that includes a blind channel estimator, a reference cell based channel estimator, and a decision directed channel estimator. In the example shown, two types of information are passed from Flash media 102 to read controller 108. Read back data is data or values obtained from non-reference cells (e.g., cells used to store user or application data). Reference cell data is data or values obtained from reference cells (e.g., cells used to store overhead information). In the example shown, reference cell based channel estimator 800 performs channel estimation using reference cell data and blind channel estimator 500 and decision directed channel estimator 600 perform channel estimation using read back data.

Blind channel estimator 500 passes bin ranges to reference cell based channel estimator 800 which in turn passes bin ranges to decision directed channel estimation. Reference cell based channel estimator updates and/or modifies the received bin ranges as appropriate based on the reference cell data. The bin ranges output by blind channel estimator 500 and reference cell based channel estimator 800 do not necessarily have the same bin range values.

In some embodiments, blind channel estimator 500 and reference cell based channel estimator 800 adjust one or more of the bin ranges by incrementing or decrementing a previous bin range by k*μ where μ is a constant and k is a scaling factor (integer or otherwise). In some embodiments, since the values or levels written to reference cells are known (whereas it is not known what values or levels read back data "actually" are), a larger constant (e.g., $\mu_{larger}$) is used to increment/decrement a previous bin value during reference cell based estimation and a smaller constant (e.g., $\mu_{smaller}$) is used during blind channel estimation.

Decision directed channel estimator 600 outputs decision criteria and passes it to channel corrector 502. Channel corrector 502 outputs channel corrected read back data.

Figure 9:
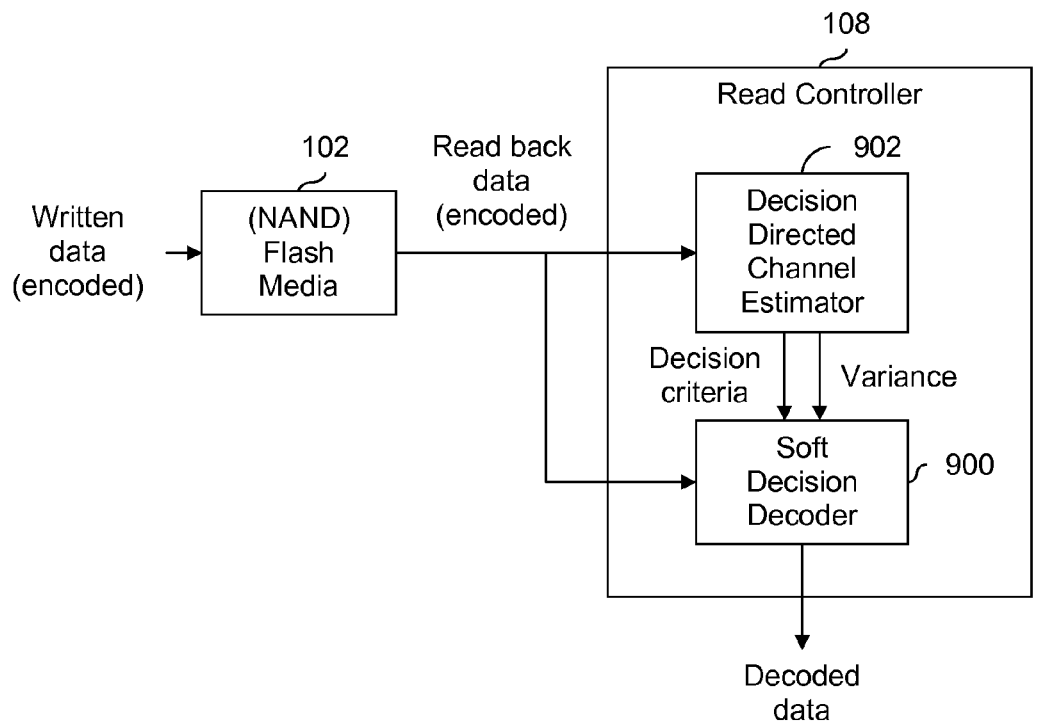
FIG. 9 is a diagram showing an embodiment of a read controller that includes a decision directed channel estimator and a soft decision decoder.

FIG. 9 is a diagram showing an embodiment of a read controller that includes a decision directed channel estimator and a soft decision decoder. In the example shown, data written to and read back from Flash media 102 is encoded and soft decision decoder 900 decodes the encoded data. A variety of codes can be used, such as error detection or error correction codes. As storage density increases and geometries decrease, read back data will have increasingly more noise or errors and coding will tend to become more attractive. In some embodiments, soft decision decoder 900 is an LDPC decoder. Any soft decision decoder can be used.

In the example shown, decision directed channel estimator 902 outputs both decision criteria and variance. Returning to the example of FIG. 2, decision directed channel estimator 902 outputs for that example a decision criteria (sometimes referred to as a center, mean, or expected value) and variance for each of 202a-202d. In one example in vector form it is [$center_{202a}$ $center_{202b}$ $center_{202c}$ $center_{202d}$] and [$\sigma^2_{202a}$ $\sigma^2_{202b}$ $\sigma^2_{202c}$ $\sigma^2_{202d}$]. In some embodiments, estimation of the means and variance is done on a cell-by-cell basis and thus there is a mean and variance vectors for each cell.

Although not shown in this figure, a decision directed channel estimator that outputs decision criteria and variance can be used with a variety of other modules, such as other channel estimators, channel correctors, etc. For example, in some embodiments, a blind channel estimator is used in combination with the system shown in FIG. 9.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   an interface configured to:
      receive a read value that is read from a multi-level storage device;
      receive a set of bins having bin ranges; and
      receive a set of amounts corresponding to the set of bins, wherein each amount in the set indicates an amount of read values which fall into the corresponding bin; and
   a processor configured to adjust one or more of the bin ranges, including by:
      in the event there is a first bin range that is less than the received read value, increasing at least the first bin range; and
      in the event there is a second bin range that is greater than the received read value, decreasing at least the second bin range.

2. The system of claim 1 further comprising a channel corrector configured to perform a read of the multi-level storage device using the adjusted one or more bin ranges.

3. The system of claim 1, wherein:
   there are M+1 bins and M bin ranges corresponds to bin centers; and
   the amount of read values which fall into a lowest bin and a highest bin in the set is substantially equal to 1/(2M) and the amount of read values which fall into other bins in the set is substantially equal to 1/M.

4. The system of claim 1, wherein the processor is configured to adjust a bin range by incrementing or decrementing a previous bin range by k*μ, where k is an integer and μ is a step size.

5. The system of claim 4, wherein the processor is further configured to determine a value for μ by sweeping μ and selecting μ based at least in part on error rate.

6. The system of claim 1, wherein the processor is further configured to determine a number of read values to obtain from the multi-level storage device based at least in part on a number of levels stored by the multi-level storage device.

7. The system of claim 1, wherein the processor is further configured to scramble the read value to obtain a scrambled value and determine and adjust using the scrambled value.

8. A system, comprising:
   an interface configured to:
      receive a decision that is associated with a multi-level storage device; and
      receive a set of bins having bin ranges; and
   a processor configured to:
      select one of the set of bins that corresponds to the received decision; and adjust one or more of the bin ranges, including by:
in the event a center of the selected bin is less than the decision, increase at least those bit ranges that correspond to the select bin; and
in the event the center of the selected bin is greater than the decision, decrease at least those bit ranges that correspond to the select bin.

9. The system of claim 8 further comprising a channel corrector configured to perform a read of the multi-level storage device using the one or more adjusted bin ranges.

10. The system of claim 8, wherein:
the decision is made based on which bin in the set a read value falls in; and
the multi-level storage device has M levels and there are M+1 bins and the M bin ranges correspond to centers of the M levels.

11. The system of claim 10, wherein the processor is configured to adjust by adjusting the bin range that corresponds to the decision made and maintaining the other M−1 bin ranges.

12. The system of claim 10, wherein the processor is configured to make a decision by selecting which one of the M bin ranges is closest to the read value.

13. The system of claim 8, wherein the processor is further configured to generate a variance based at least in part on the read value.

14. The system of claim 13, wherein the multi-level storage device has M levels and generating a variance includes generating a set of M variances.

15. The system of claim 13 further comprising a soft decision decoder configured to decode the read value using at least one of the set of decision criteria after adjustment and the variance.

16. A method, comprising:
receiving a read value that is read from a multi-level storage device;
receiving a set of bins having bin ranges;
receiving a set of amounts corresponding to the set of bins, wherein each amount in the set indicates an amount of read values which fall into the corresponding bin; and
adjusting, using a processor, one or more of the bin ranges, including by:
in the event there is a first bin range that is less than the received read value, increasing at least the first bin range; and
in the event there is a second bin range that is greater than the received read value, decreasing at least the second bin range.

17. A method, comprising:
receiving a decision that is associated with a multi-level storage device;
receiving a set of bins having bin ranges;
select one of the set of bins that corresponds to the received decision; and
adjusting, using a processor, one or more of the bin ranges, including by:
in the event a center of the selected bin is less than the decision, increasing at least those bit ranges that correspond to the select bin; and
in the event the center of the selected bin is greater than the decision, decreasing at least those bit ranges that correspond to the select bin.

18. The system of claim 1, wherein the bin ranges include bin centers and the processor is configured to adjust, including by:
in the event there is a first bin center that is less than the received read value, increasing at least the first bin center; and
in the event there is a second bin center that is greater than the received read value, decreasing at least the second bin center.

19. The method of claim 16, wherein the bin ranges include bin centers and adjusting includes:
in the event there is a first bin center that is less than the received read value, increasing at least the first bin center; and
in the event there is a second bin center that is greater than the received read value, decreasing at least the second bin center.

20. The system of claim 1, wherein the bin ranges include thresholds and the processor is configured to adjust, including by:
in the event there is a first threshold that is less than the received read value, increasing at least the first threshold; and
in the event there is a second threshold that is greater than the received read value, decreasing at least the second threshold.

21. The method of claim 16, wherein the bin ranges include thresholds and adjusting includes:
in the event there is a first threshold that is less than the received read value, increasing at least the first threshold; and
in the event there is a second threshold that is greater than the received read value, decreasing at least the second threshold.

22. The system of claim 8, wherein the bin ranges include one or more of the following: a bin center or a threshold.

23. The method of claim 17, wherein the bin ranges include one or more of the following: a bin center or a threshold.

* * * * *

UNITED STATES PATENT AND TRADEMARK OFFICE
CERTIFICATE OF CORRECTION

| | |
|---|---|
| PATENT NO. | : 8,443,244 B2 |
| APPLICATION NO. | : 13/456065 |
| DATED | : May 14, 2013 |
| INVENTOR(S) | : Marrow et al. |

It is certified that error appears in the above-identified patent and that said Letters Patent is hereby corrected as shown below:

In the Claims,

Column 10, Line 40:
delete "corresponds"

Column 10, Line 40:
insert -- corresponding -- after ranges

Signed and Sealed this
Tenth Day of February, 2015

Michelle K. Lee
*Deputy Director of the United States Patent and Trademark Office*